US005361032A

United States Patent [19]

Waterbly

[11] Patent Number: 5,361,032
[45] Date of Patent: Nov. 1, 1994

[54] METHOD OF TROUBLESHOOTING ELECTRONIC CIRCUIT BOARD ASSEMBLIES USING TEMPERATURE ISOLATION

[75] Inventor: David A. Waterbly, Peoria, Ariz.

[73] Assignee: Motorola, Inc., Schaumburg, Ill.

[21] Appl. No.: 826,552

[22] Filed: Jan. 27, 1992

[51] Int. Cl.⁵ ............................................. G01R 27/26
[52] U.S. Cl. ..................................... 324/537; 324/765
[58] Field of Search ............... 324/537, 158 T, 158 D, 324/104, 501

[56] References Cited

U.S. PATENT DOCUMENTS

| | | | |
|---|---|---|---|
| 3,665,307 | 5/1972 | Cocca | 324/158 T |
| 3,745,460 | 7/1973 | Belzer | 324/158 T |
| 3,842,346 | 10/1974 | Bobbit | 324/537 |
| 4,342,959 | 4/1982 | Skilling | 324/537 |
| 4,565,966 | 1/1986 | Burr et al. | 324/158 F |
| 5,006,808 | 4/1991 | Watts | 324/537 |
| 5,028,988 | 7/1991 | Porter et al. | 324/158 D |
| 5,030,905 | 7/1991 | Figal | 324/158 D |
| 5,036,273 | 7/1991 | Groeseneken et al. | 374/158 D |
| 5,047,713 | 9/1991 | Kirino et al. | 324/158 T |

Primary Examiner—Maura K. Regan
Attorney, Agent, or Firm—Michael D. Bingham; Walter W. Nielsen

[57] ABSTRACT

A method for troubleshooting an electronic circuit board assembly which comprises a plurality of components interconnected by a plurality of nodes having electrical terminals without the need to de-solder. The method comprises measuring the resistance value for one of the plurality of nodes, and, if the measured resistance value does not match a target value, individually cooling or heating each of the components which are coupled to such node while simultaneously measuring the resistance value for the node, and identifying as faulty that component for which the measured resistance deviates most from the target value.

20 Claims, 2 Drawing Sheets

METHOD OF TROUBLESHOOTING ELECTRONIC CIRCUIT BOARD ASSEMBLIES USING TEMPERATURE ISOLATION

TECHNICAL FIELD

This invention relates generally to electronic circuit board assembly testing and diagnosis, and, more particularly, to a method of isolating faults on such an assembly without de-soldering components.

BACKGROUND OF THE INVENTION

The present invention has utility in troubleshooting and repairing electronic circuit board assemblies where electronic components are soldered directly in place.

It is known that various faults in a circuit board assembly may be isolated by measuring the resistance between selected points or nodes. A faulty integrated circuit will resistively pull down a node to which it is electrically connected. Improper resistance readings indicate that a fault exists within the assembly. A technician can then use repair procedures in an attempt to isolate the faulty part, remove it by de-soldering, confirm the fault is cleared, and replace the component with a good one. However, attempts to isolate the fault are complicated by the number of resistances that may be connected to the faulty node. The lowest resistance present will dominate the node and make finding the fault difficult.

In production environments, it is desirable to isolate faults quickly and accurately in order to minimize the amount of labor required to correct the fault, thus reducing the cost of manufacture. It is also desirable to be able to identify faulty components on circuit board assemblies in as short a test cycle as possible, i.e. within a maximum of several hours rather than several days, because in this manner the odds of correlating component faults to a particular batch of faulty component supplies is much greater, and such faulty components can be immediately isolated, re-tested, and, if necessary, removed from the production of further circuit board assemblies, thereby resulting in significant labor and piece-part savings.

It is also desirable to minimize the amount of de-soldering of components from the board to limit possible damage to the circuit board and to adjoining components. By minimizing the de-soldering of components, manufacturing costs can be significantly reduced. For example, if the average cost to manufacture a circuit board is $2,500, and a typical quality control procedure requires that a board must be scrapped if more than 3 components must be re-soldered, then a significant reduction in the number of scrapped boards would result if components did not have to be de-soldered to be tested. Moreover, for circuit boards onto which components have been surface-mounted it is difficult, if not impossible, to de-solder components to test them, due to the malleability limitations of their leads.

BRIEF SUMMARY OF THE INVENTION

The present invention comprises a method of troubleshooting electronic circuit board assemblies in such a manner so as to quickly identify a faulty component on the board with high accuracy without the need to de-solder components.

A faulty component will typically be evidenced by a lower than normal resistance between connection points. Such faults are characterized by the magnitude of the resistance. A moderate resistance change is called a resistive pull-down, while resistances down to 1.5 ohms are called soft shorts.

A significant factor in being able to identify an integrated circuit with a fault from a plurality of components on a circuit board is the fact that the silicon basis of the component has a predictable resistance-versus-temperature characteristic. Using a coolant on a given device will lower the resistance of the silicon, including any fault resistance. Correspondingly, applying heat to such a device will increase the resistance of the silicon, including any fault resistance.

In addition, the resistive value of a parallel circuit will be lower than the lowest resistance in the circuit. Thus, changing the resistance of any resistance that is not the lowest in the circuit will not have a dramatic effect on the total parallel resistance, but changing the lowest resistance will have a major effect on total resistance.

The method of the present invention for identifying faulty components relies upon measuring the resistance between nodes and comparing that measurement to a known standard. If a deviation is found, all components connected to the faulty node are identified. Each component is then cooled or heated while the resistance is monitored. The component which results in the greatest deviation in resistance when it is cooled or heated is identified as the faulty device.

Accordingly, it is an advantage of the present invention to be able to isolate a fault with particularity from a plurality of components on a circuit board.

It is also an advantage of the present invention to be able to isolate the faulty component without the need to de-solder multiple components.

It is another advantage of the present invention that no specialized test tools are required, just an ohmmeter and a means for cooling or heating the components.

These and other advantages are achieved in accordance with a preferred embodiment of the invention by providing a method for troubleshooting an electronic circuit board assembly which comprises a plurality of components interconnected by a plurality of nodes and which has an electrical terminal without the need to de-solder, the method comprising the steps in sequence of: (a) determining a target resistance value for each of the plurality of nodes relative to the electrical terminal; (b) measuring the resistance value for one of the plurality of nodes relative to the terminal, and, if the measured resistance value matches the target value, proceeding to step (f), otherwise proceeding to step (c); (c) cooling or heating one of the components connected to the node while simultaneously measuring the deviation of the resistance value for the one node from the target resistance value; (d) repeating step (c) until all components coupled to the one node have been checked; (e) identifying as faulty the component having the greatest deviation of the measured resistance value from the target resistance value; and (f) repeating step (b) until each of the plurality of nodes has been checked.

BRIEF DESCRIPTION OF THE DRAWINGS

The invention is pointed out with particularity in the appended claims. Other features of the invention will become more apparent and the invention will be best understood by referring to the following detailed description in conjunction with the accompanying drawings in which:

DETAILED DESCRIPTION OF THE PREFERRED EMBODIMENT

Figure 1:
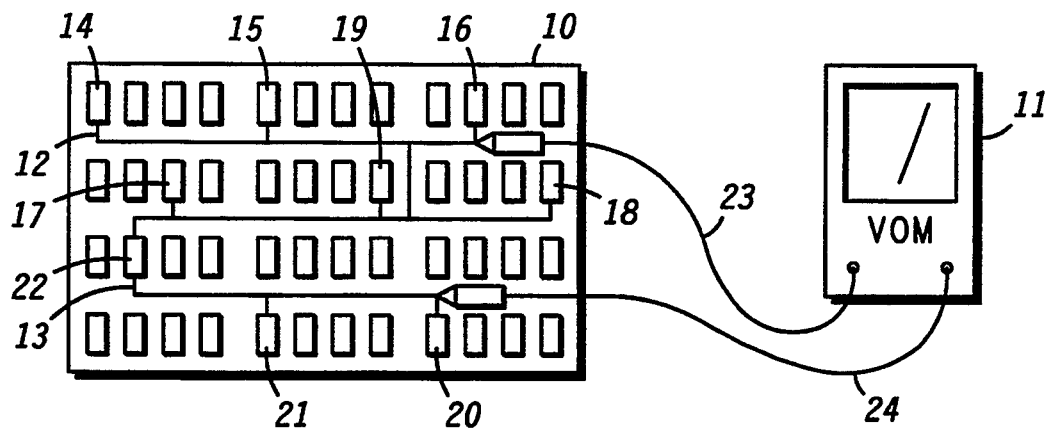
FIG. 1 shows an electronic circuit board assembly with a plurality of electronic components, ready for troubleshooting in accordance with the present invention.

FIG. 1 shows an electronic circuit board assembly 10 with a plurality of electronic components 14-22, ready for troubleshooting in accordance with the present invention. A conductor 12 has electrical connections to components or devices such as integrated circuits 14-19 and 22. A conductor 13 has electrical connections to integrated circuits 20-22.

The meter probes 23 and 24 are connected to a known good circuit board in order to determine a target resistance reading between conductors 12 and 13. After connecting the probes 23 and 24 to a suspect board and noting that the resistance reading between 12 and 13 on the board under test does not match the expected value, devices 14-22 would be suspect.

Isolation of the faulty component relies on the property of silicon devices that the resistance of the silicon will vary with temperature. If the temperature of the device is lowered, its resistance also decreases, and vice versa.

Each of the devices connected to conductor 12 or 13 will have some characteristic resistance. In general, the parallel combination of these resistances can be calculated as:

$$R_{total} = \frac{1}{\frac{1}{R_1} + \frac{1}{R_2} + \frac{1}{R_3} \cdots \frac{1}{R_n}}$$

where $R_{total}$ represents the resistance measured at a node, and $R_1, R_2, R_3 \ldots R_n$ represent the resistances of each of the n components connected to the node. Note that the lowest value individual resistance will dominate the total resistance.

Figure 2:
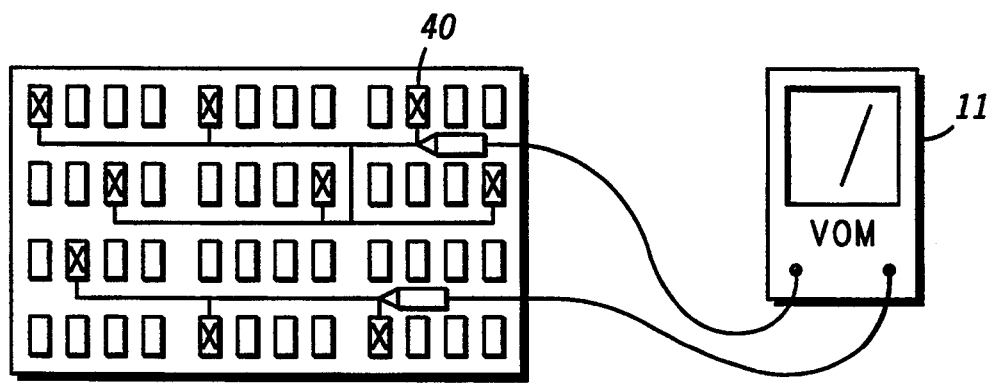
FIG. 2 shows how components connected together to a common electrical connection are marked for cooling or heating in accordance with the present invention.

FIG. 2 shows how components connected together to a common electrical connection are marked for cooling or heating in accordance with the present invention. A technician would use any appropriate means, such as a marking pen, to identify all components that electrically connect to the node that has been determined to be faulty, by labelling them in some fashion such as with an "x" 40. These components would be suspect and would be subject to the next step in the method.

Figure 3:
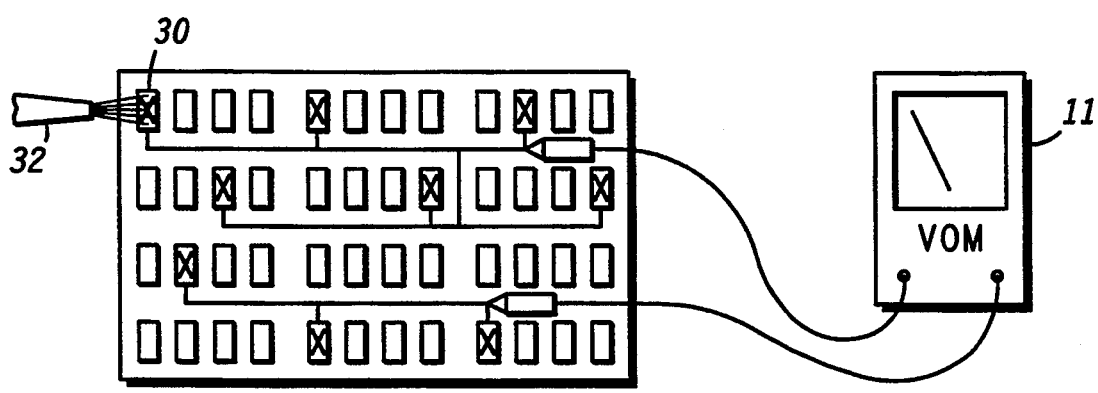
FIG. 3 shows how the resistance value may be observed to deviate when a coolant is directed upon a faulty component in accordance with the present invention.

Referring to FIG. 3, a chilled liquid or gas such as liquid nitrogen 32 is used to cool each of the suspect components in turn, while observing ohm meter 11. The deviation of resistance is noted. Assuming that component 30 is the faulty component, once it is chilled using the cooling fluid, meter 11 will register a greater deviation than when any of the other suspect components are chilled. As predicted by the formula for calculating parallel resistance in a circuit, the device that produces the greatest deviation in resistance is the faulty device.

Alternatively, if the suspected components had been heated by, for example, a heat gun, the device that produced the greatest deviation in resistance would be identified as faulty.

Figure 4:
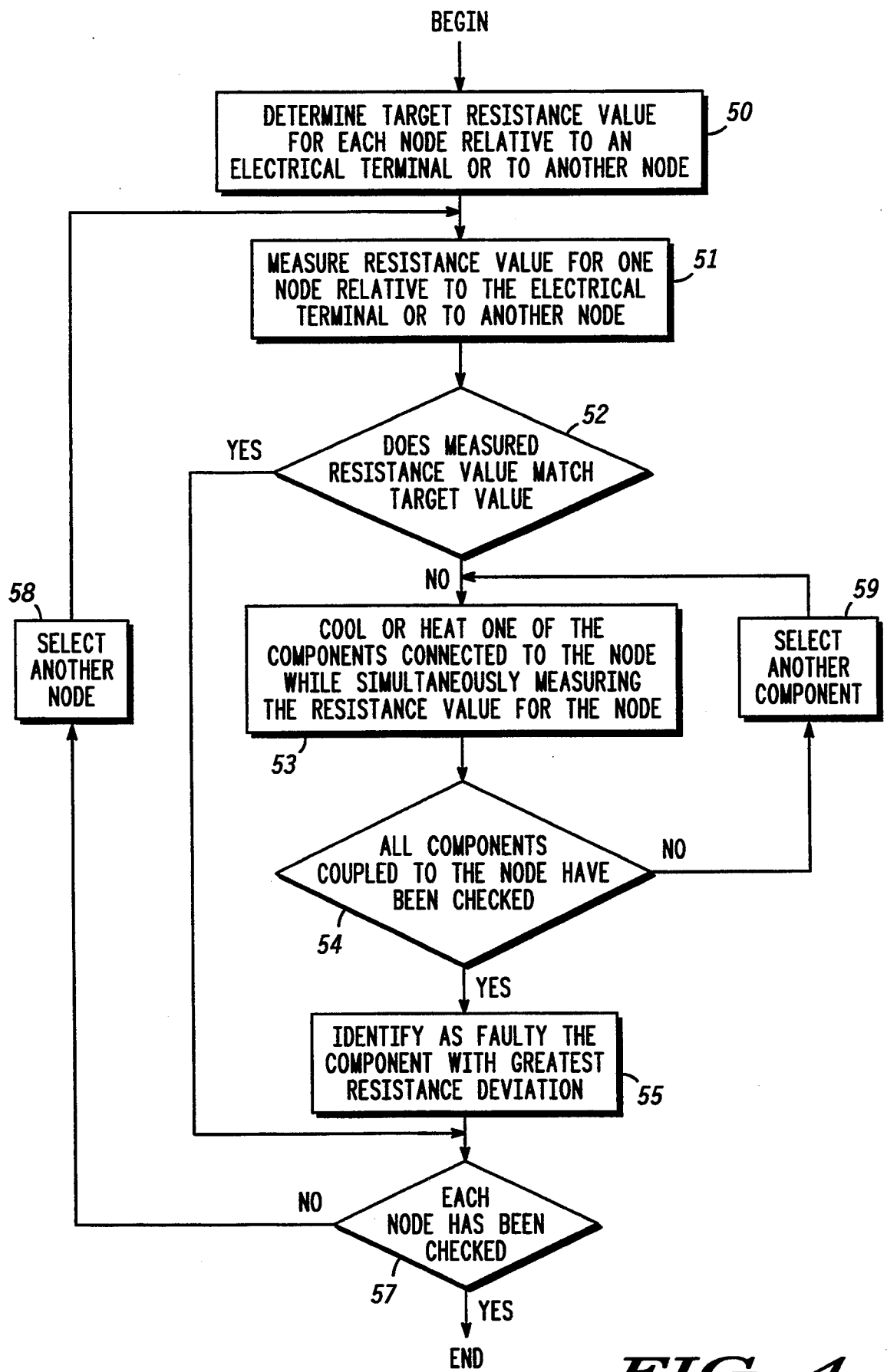
FIG. 4 shows a flow chart of a method of troubleshooting electronic circuit board assemblies in accordance with the present invention.

FIG. 4 shows a flow chart of a method of troubleshooting electronic circuit board assemblies in accordance with the present invention. In step 50 a target resistance value is determined for each node of the board relative to an electrical terminal, such as ground or a positive supply voltage.

Next, in step 51 the resistance value for one node is measured relative to the electrical terminal. Regarding step 52, if the measured resistance value matches the target value, then the method proceeds to step 57, but, if not, it proceeds to step 53.

In step 53 one of the components connected to the one node is either cooled or heated while simultaneously any change in the resistance value between the one node and the electrical terminal is observed.

Step 54 represents a counter to determine whether all components coupled to the one node have been checked using step 53. If so, the method proceeds to step 55; otherwise, it proceeds to step 59. In step 59, another component is selected for testing, and step 53 of the method is repeated.

After all components coupled to the one node have been checked, using step 53, then in step 55 the component having the greatest deviation in resistance is identified as faulty, and the method proceeds to step 57.

Step 57 represents a counter to determine whether every node on the board has been checked. If so, the method ends; otherwise, it proceeds to step 58, where another node is selected, and hence to step 51.

According to an alternative embodiment, also encompassed by the method shown in FIG. 4, a target resistance value is determined for each node relative to another selected node in step 50. In step 52 the resistance value for each node is then measured relative to such selected node in step 51. Aside from this modification, i.e. measuring the resistance of nodes relative to a selected node, rather than relative to an electrical terminal, the alternative method is identical to the preferred embodiment of the method described immediately above.

It will also be apparent to those skilled in the art that the disclosed invention may be modified in numerous ways and may assume many embodiments other than the preferred form specifically set out and described above.

For example, while a liquid nitrogen spray is disclosed herein as the preferred method of cooling the components, it will be understood by those skilled in the art that alternative coolants may be used, such as Freon ® or compressed air. However, the use of liquid nitrogen in practicing the present invention was found to be preferable to the use of Freon ®, because it leaves no moisture or residue, and because it has no adverse environmental effects. Liquid nitrogen is also preferable to both Freon ® and to compressed air, because a technician can more precisely control the degree of cooling by varying the time period of coolant release, and because liquid nitrogen is relatively cooler than either Freon ® or compressed air.

Accordingly, it is intended by the appended claims to cover all modifications of the invention which fall within the true spirit and scope of the invention.

What is claimed is:

1. A method for troubleshooting, without the need to de-solder, an electronic circuit board assembly which comprises a plurality of electrical conductors, a plurality of nodes each comprising an interconnected group of said electrical conductors, a plurality of integrated circuit components coupled to each of said nodes, and an electrical terminal, said method comprising the steps in sequence of:
   (a) determining a target resistance value for each of said plurality of nodes relative to said electrical terminal;
   (b) measuring the resistance value for one of said plurality of nodes relative to said terminal, and, if said measured resistance value matches said target value, proceeding to step (f), otherwise proceeding to step (c);
   (c) cooling or heating a single one of the components connected to said node while simultaneously measuring the deviation of said resistance value for said one node from said target resistance value;
   (d) repeating step (c) until all components coupled to said one node have been checked;
   (e) identifying as faulty the component having the greatest deviation of said measured resistance value from said target resistance value; and
   (f) repeating step (b) until each of said plurality of nodes has been checked.

2. The method recited in claim 1, wherein in steps (b) and (c) said resistance value is measured with an ohm meter.

3. The method recited in claim 1, wherein in step (c) said one component is cooled by exposing it to a chilled liquid or gas.

4. The method recited in claim 1, wherein in step (c) said one component is cooled by exposing it to liquid nitrogen.

5. The method recited in claim 1, wherein in step (c) said one component is cooled by exposing it to a refrigerant spray.

6. The method recited in claim 1, wherein in step (c) said one component is heated by exposing it to a heated liquid or gas.

7. The method recited in claim 1, wherein said plurality of components comprises at least one integrated circuit.

8. The method recited in claim 1, wherein in step (e) said component is identified as faulty if said measured resistance value decreases substantially from said target resistance value.

9. The method recited in claim 1, wherein said electrical terminal is at ground potential.

10. The method recited in claim 1, wherein said electrical terminal is at the highest potential in the system.

11. The method recited in claim 1, wherein between steps (b) and (c) the following step is performed:
   (b1) identifying all components coupled to said node with a visually perceptible mark.

12. A method for troubleshooting, without the need to desolder, an electronic circuit board assembly which comprises a plurality of electrical conductors, a plurality of nodes each comprising an interconnected group of said electrical conductors, and a plurality of integrated circuit components coupled to each of said nodes, said method comprising the steps in sequence of:
   (a) determining a target resistance value for each of said plurality of nodes relative to another node;
   (b) measuring the resistance value for one of said plurality of nodes relative to another node, and, if said measured resistance value matches said target value, proceeding to step (f), otherwise proceeding to step (c);
   (c) cooling or heating a single one of the components connected to said node while simultaneously measuring the deviation of said resistance value for said one node from said target resistance value;
   (d) repeating step (c) until all components coupled to said one node have been checked;
   (e) identifying as faulty the component having the greatest deviation of said measured resistance value from said target resistance value; and
   (f) repeating step (b) until each of said plurality of nodes has been checked.

13. The method recited in claim 12, wherein in steps (b) and (c) said resistance value is measured with an ohm meter.

14. The method cited in claim 12, wherein in step (c) said one component is cooled by exposing it to a chilled liquid or gas.

15. The method recited in claim 12, wherein in step (c) said one component is cooled by exposing it to liquid nitrogen.

16. The method recited in claim 12, wherein in step (c) said one component is cooled by exposing it to a refrigerant spray.

17. The method recited in claim 12, wherein in step (c) said one component is heated by exposing it to a heated liquid or gas.

18. The method recited in claim 12, wherein said plurality of components comprises at least one integrated circuit.

19. The method recited in claim 12, wherein in step (e) said component is identified as faulty if said measured resistance value decreases substantially from said target resistance value.

20. The method recited in claim 12, wherein between steps (b) and (c) the following step is performed:
   (b1) identifying all components coupled to said node with a visually perceptible mark.

* * * * *